(12) United States Patent
Tsui et al.

(10) Patent No.: US 7,266,465 B1
(45) Date of Patent: Sep. 4, 2007

(54) WIDEBAND DIGITAL IFM RECEIVER WITH FREQUENCY CONFIRMATION

(75) Inventors: James B. Y. Tsui, Dayton, OH (US); Charles Richard Ward, Wellsboro, PA (US); Stuart Mitchell Lopata, Palisades Park, NJ (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 11/270,096

(22) Filed: Nov. 9, 2005

(51) Int. Cl.
*G01R 23/00* (2006.01)
*G01R 23/16* (2006.01)

(52) U.S. Cl. .................. 702/77; 702/75; 342/196
(58) Field of Classification Search ............. 702/77, 702/75
See application file for complete search history.

(56) References Cited

U.S. PATENT DOCUMENTS

| | | | |
|---|---|---|---|
| 4,336,541 A | 6/1982 | Tsui et al. | |
| 4,426,648 A | 1/1984 | Tsui et al. | |
| 4,547,727 A | 10/1985 | Tsui et al. | |
| 4,633,516 A * | 12/1986 | Tsui ...................... | 455/226.1 |
| 5,099,243 A * | 3/1992 | Tsui et al. ............... | 324/76.47 |
| 5,291,125 A | 3/1994 | Tsui et al. | |
| 5,499,391 A | 3/1996 | Tsui | |
| 5,793,323 A * | 8/1998 | Tsui ........................ | 342/13 |
| 5,963,164 A * | 10/1999 | Tsui et al. ............... | 342/196 |
| 6,014,554 A * | 1/2000 | Smith ..................... | 455/340 |
| 6,411,076 B1 | 6/2002 | Rudish | |
| 2004/0148116 A1 * | 7/2004 | Rao ........................ | 702/75 |

* cited by examiner

*Primary Examiner*—Jeffrey R. West
*Assistant Examiner*—Lisa Sievers
(74) *Attorney, Agent, or Firm*—RatnerPrestia

(57) ABSTRACT

An apparatus for confirming a frequency measurement of a received signal includes a discrete Fourier transform (DFT) module for receiving a sampled digital signal. The DFT module is configured to analyze the received sampled digital signal, and output amplitude values at different frequency components. A threshold comparator is included for receiving the amplitude values of the frequency components and outputting a thresholded-amplitude value exceeding a predetermined threshold value. A frequency confirmation is provided based on the thresholded-amplitude value. The sampled digital signal is sampled at a sampling frequency of $f_s$, and the DFT module is configured to analyze the received sampled digital signal at a frequency bandwidth that is equal to or less than $f_s$. The frequency bandwidth is equal to the sampling frequency of $f_s$, when the received sampled digital signal includes I and Q signals. The DFT module is configured to analyze the received sampled digital signal by examining N frequency components, where N equals the total number of frequency components equally spaced between 0 and the sampling frequency.

16 Claims, 13 Drawing Sheets

WIDEBAND DIGITAL IFM RECEIVER WITH FREQUENCY CONFIRMATION

TECHNICAL FIELD

The present invention relates, in general, to a method and apparatus for an instantaneous frequency measurement (IFM) receiver. More specifically, the present invention relates to a method and apparatus for separately confirming an instantaneous frequency of an input signal estimated by an IFM receiver.

BACKGROUND OF THE INVENTION

Electronic surveillance measurement (ESM) receivers commonly require that frequency calculations be performed on a received signal from targets of interest. The frequency of an input signal is often measured using an instantaneous frequency measurement (IFM) receiver. The IFM receiver, generally, uses a difference in phase between a delayed and a non-delayed version of an input signal to calculate the frequency of the input signal.

The IFM receiver may cover a wide input frequency range such as, for example, in the range from 2 GHz to 18 GHz. The receiver may process short pulse widths with decent frequency accuracy. A conventional IFM receiver may be built through analog means with frequency correlators. The advancement in digital signal processing techniques has resulted in IFM receiver approaches with a one bit digitized signal. An example of an IFM receiver with a one bit digitized signal is disclosed in U.S. patent application Ser. No. 11/170,121, filed on Jun. 29, 2005, which is incorporated herein by reference in its entirety for its teachings on instantaneous frequency measurements.

It is important to be able to confirm the measurement of frequency of an IFM receiver. Presently, IFM receivers do not do this directly, but rather, try to detect a variety of conditions that could lead to an incorrect measurement.

A continuing need exists for an improved instantaneous frequency measurement (IFM) receiver. In particular, a need exists for directly confirming the measurement result of an IFM receiver that is more reliable than existing techniques currently in use.

SUMMARY OF THE INVENTION

To meet this and other needs, and in view of its purposes, the present invention provides an apparatus for confirming a frequency measurement of a received signal. The apparatus includes a specialized discrete Fourier transform (DFT) module for receiving a sampled digital signal. The DFT module is configured to analyze the received sampled digital signal, and output amplitude values at different frequency components in the vicinity of the potentially correct frequencies detected by the IFM. A threshold comparator is included for receiving the amplitude values of the frequency components and outputting a thresholded-amplitude value exceeding a predetermined threshold value. A frequency confirmation is provided based on the thresholded-amplitude value. The sampled digital signal is sampled at a sampling frequency of $f_s$, the DFT module is configured to analyze the received sampled digital signal at a frequency bandwidth that is equal to or less than $f_s$. The frequency bandwidth is equal to the sampling frequency of $f_s$, when the received sampled digital signal includes I and Q signals. The specialized DFT module is configured to analyze the received sampled digital signal by computing three out of a possible N frequency components, where N equals the total number of frequency components equally spaced between 0 and the sampling frequency. N may also equal the total number of time samples used in each DFT analysis to determine the amplitude values corresponding to the N frequency components.

Another embodiment of the invention is an instantaneous frequency measurement (IFM) receiver. The IFM receiver includes a receiver module for determining a frequency of a received signal, and a discrete Fourier transform (DFT) module configured to analyze 3 frequency components of the received signal at k−1, k, and k+1. The k corresponds to a frequency component similar to the frequency determined by the receiver module, and k−1 and k+1 are adjacent frequency components at opposite sides of the k frequency component. The IFM receiver includes a threshold comparator for receiving amplitude values of the frequency components, and outputting a thresholded-amplitude value exceeding a predetermined threshold value, and a frequency valid signal provided as a frequency confirmation signal, based on the thresholded-amplitude value.

The specialized DFT module may include the following DFT kernel function:

$$\begin{bmatrix} q_1,k-1 & q_1,k & q_1k+1 \\ q_2,k-1 & q_2,k & q_2,k+1 \\ \vdots & \vdots & \vdots \\ \vdots & \vdots & \vdots \\ q_n,k-1 & q_n,k & q_n,k+1 \end{bmatrix}$$

where k−1, k, and k+1 are adjacent frequency components, n is the number of time samples used in each DFT analysis, and q is a kernel having four possible values of 1, −1, j and −j, where j is $\sqrt{-1}$.

Another embodiment of the invention includes a method of confirming a frequency measurement of a received signal. The method includes the steps of: (a) receiving a sampled digital signal; (b) performing a specialized DFT process on the sampled digital signal, and outputting at least one amplitude value corresponding to at least one frequency component resulting from the DFT process; (c) comparing the at least one amplitude value of the at least one frequency component with a predetermined threshold value, and (d) confirming the frequency measurement of the received signal if the at least one amplitude value exceeds the predetermined threshold value in step (c). Step (b) may include outputting amplitude values of at least 3 frequency components, wherein the at least 3 frequency components are centered about the frequency measurement of the received signal.

It is understood that the foregoing general description and the following detailed description are exemplary, but are not restrictive, of the invention.

BRIEF DESCRIPTION OF THE DRAWINGS

The invention is best understood from the following detailed description when read in connection with the accompanying drawing. Included in the drawing are the following figures.

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

The present invention provides frequency confirmation for a measurement performed by an IFM receiver. The present invention may be implemented, for example, in a field programmable gate array (FPGA), or a digital signal processor (DSP). The present invention may be integrated with a digital IFM receiver, such as disclosed in U.S. patent application Ser. No. 11/170,121, filed on Jun. 29, 2005, by the inventors of the present application. In another embodiment, the present invention may be implemented in a separate unit, or module, from the digital IFM receiver.

An IFM receiver may cover a wide input frequency range from 2 GHz to 18 GHz. It may process short pulse widths with good frequency accuracy. The IFM receiver may be built through analog techniques using frequency correlators. The IFM receiver may also be built using digital signal processing modules, such as the one bit analog-to-digital converters (ADCs) shown in FIG. 1, which is described in more detail later. The one bit ADCs are used because of simplicity. Other configurations may also be used.

It will be appreciated that IFM receivers (analog or digital) may generate erroneous frequency data when there are simultaneous signals presented at the input of the IFM receiver. If simultaneous signals are present, the frequency measurement from the IFM receiver may be questionable. For example, when simultaneous signals exist, the IFM receiver may generate a correct frequency for only one of the input signals. Thus, the frequency generated by the IFM receiver is not positively confirmed as a correct or incorrect frequency. It is also important to know that the frequency estimated by the IFM receiver is incorrect. In the field of IFM receivers, it has been difficult to identify an erroneous frequency.

There has been a suggestion to detect the existence of simultaneous signals, which when present would lead to a conclusion that the IFM frequency identified by the IFM receiver is questionable. Such suggestion, however, is inadequate, because when simultaneous signals exist, one of those signals may be correct. Accordingly, the present invention advantageously identifies an erroneous frequency estimated by an IFM receiver, using a method other than by detecting simultaneous input signals. Furthermore, the present invention advantageously determines whether the frequency estimated by the IFM receiver is correct or incorrect.

Figure 1:
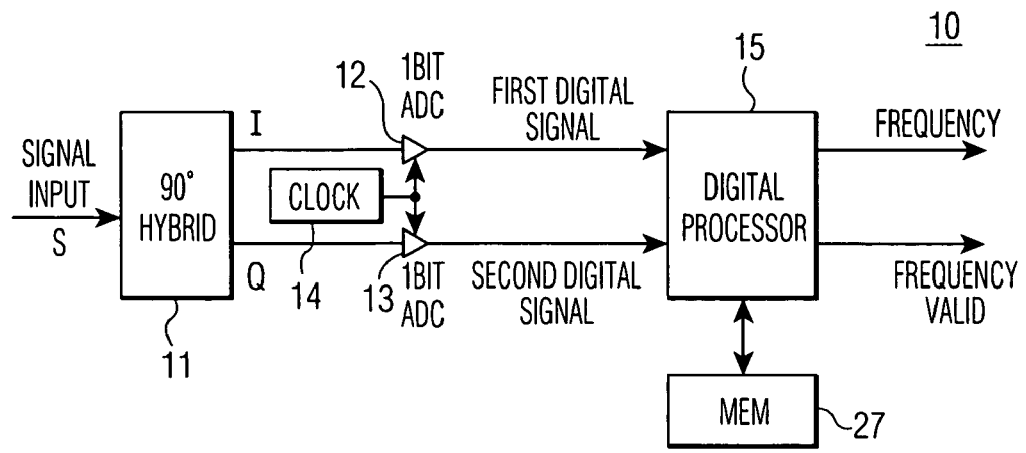
FIG. 1 shows a block diagram of a digital IFM receiver, in accordance with an exemplary embodiment of the present invention.

FIG. 1 shows a block diagram of a digital IFM receiver, in accordance with an embodiment of the present invention, generally designated as 10. As shown, IFM receiver 10 includes two-one bit ADCs, generally designated as 12 and 13. The input signal, designated as S, received by IFM receiver 10 may be a radio frequency (RF) signal or a down-converted intermediate frequency (IF) signal. The input signal is of an unknown frequency. IFM receiver 10 is configured to perform two functions, namely (1) determine the input frequency and (2) confirm the input frequency determined in (1).

As shown, the received signal passes through a 90° hybrid, generally designated as 11, to form a first analog, in-phase signal I and a second analog, quadrature signal Q. The second analog signal I is shifted in phase from the first analog signal Q by 90°. One bit ADC 12 converts the first analog signal I into a first digital signal. The other one bit ADC 13 converts the second analog signal Q into a second digital signal. The first and second digital signals are provided to digital processor 15, which determines the input frequency of the received signal.

Generally, an IFM receiver, such as receiver 10, covers a wide bandwidth, for example 2 GHz and more. In order to achieve such wide bandwidth, the sampling frequency of receiver 10 must be high. A high speed ADC having a low number of bits is used to achieve speed when sampling the input signal. As such, ADC 12 and ADC 13 are each a one bit analog-to-digital converter. It will be appreciated that one bit ADCs are available that operate at speeds of tens of GHz in sampling a signal.

In order to cover an even wider bandwidth, an in-phase (I) and a quadrature (Q) approach is used by the exemplary embodiment shown in FIG. 1. Accordingly, the input signal is split into two paths, through the 90° hybrid, to form the I signal and the Q signal. The in-phase and quadrature signals are out of phase with respect to each other by 90 degrees.

IFM receiver 10 is configured to provide the phase angle of the input signal at every sampling time, as sampled by clock 14. The ADC 12 and ADC 13 are each sampled by clock 14 in a manner that is similar to a D-type flip flop providing an output Q signal every sample period. One-bit ADC 12 digitizes the analog I signal to form a sampled $I_D$ signal, and one-bit ADC 13 digitizes the analog Q signal to form a sampled $Q_D$ signal. This advantageously simplifies the signal processing required by IFM receiver 10.

In order to cover the desired 2 GHz bandwidth, for example, a sampling frequency of 2.56 GHz is used by clock 14. A corresponding sampling time of 1τ is about 0.39 ns (1/2.56 GHz), which is the inverse of the sampling frequency. The sampling time of 1τ may be used as the shortest delay time in the IFM receiver. It will be appreciated that one bit ADCs are available at sampling speeds of up to 50 giga-samples per second (GSPS), allowing the IFM receiver to process very wide bandwidth input signals. Other sampling times may also be used, such as 2τ, 4τ, 8τ, 16τ, 32τ, and/or 64τ, and more. Since all these sampling times are multiples of one sampling time interval (1τ), there is no special timing adjustment that must be made by IFM receiver 10. All of these sampling times, if necessary, may be executed by digital processor 15.

Digital processor 15 provides the delay times to find the phase difference between the received input signal and its delayed version. This phase difference is used to find the frequency of the received input signal. The delay time provided by digital processor 15 is the interval between various sampling times. According to the above example, the shortest delay time equals one sampling time interval 1τ, which is 0.39 ns. Longer delay times may equal multiples of the one sampling time interval 1τ, namely 2τ, 4τ, 8τ, 16τ, 32τ, 64τ, etc.

As also shown in FIG. 1, the IFM receiver includes an estimated frequency signal, which identifies the frequency of input signal S, and a frequency valid signal, which is used as a frequency confirmation of the estimated frequency signal. Both signals are outputted from digital processor 15 which interfaces with memory section 27. More description of how digital processor 15 estimates the frequency of input signal S may be found in application Ser. No. 11/170,121, filed on Jun. 29, 2005, by the same inventors, which is incorporated herein by reference in its entirety.

Figure 2:
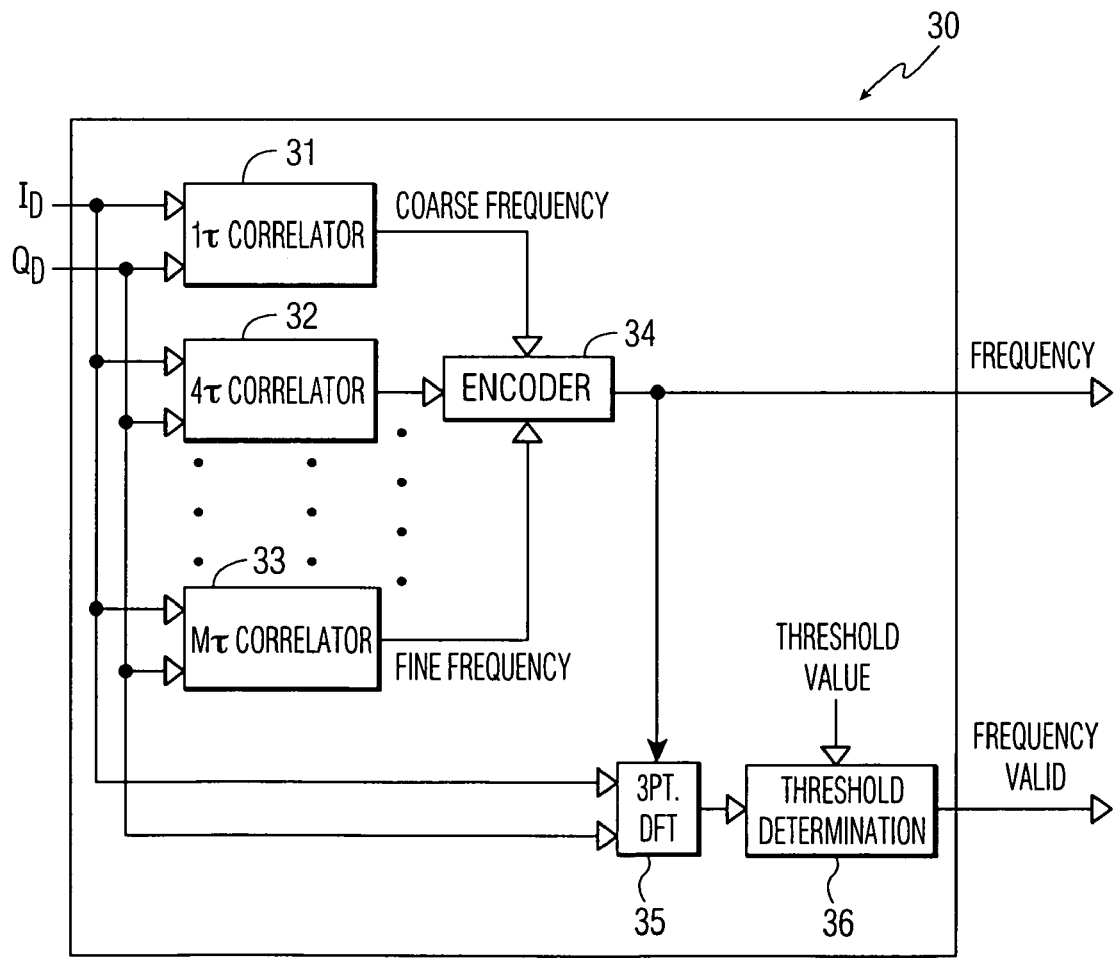
FIG. 2 shows a block diagram of a digital processor implemented in the IFM receiver shown in FIG. 1, in accordance with an exemplary embodiment of the present invention.

A functional block diagram of the present invention, as embodied in the IFM receiver of FIG. 1 is shown in FIG. 2. It will be understood that digital processor 15 of FIG. 1 may be replaced with digital processor 30 of FIG. 2. As shown in FIG. 2, sampled in-phase $I_D$ signal and sampled quadrature $Q_D$ signal is received by digital processor 30. The $I_D$ and $Q_D$ signals are divided and applied to M correlators (three correlators are shown designated as 31, 32, and 33). Each correlator is processed to include a different delay time. The shortest delay time is equal to one sampling time interval of 1τ, and the longer delay times are each made equal to a multiple of the one sampling time interval of 1τ, such as 2τ, 4τ, 8τ, 16τ, 32τ, 64τ, etc. Furthermore, each correlator includes undelayed inputs of the $I_D$ and $Q_D$ signals.

The correlators produce outputs that are the sine and cosine of the product of the input frequency and the delay time. The sine and cosine outputs from the correlators are then used by a parameter encoder, designated as 34, to report the estimated frequency at the output of digital processor 30.

Also shown in FIG. 2 is the frequency confirmation process performed by the present invention. As shown, a three (3)-point discrete Fourier transform (DFT), designated as 35, receives the input $I_D$ and $Q_D$ signals. The processed output of the 3-point DFT is then compared against a predetermined threshold value by a comparator, designated as 36. If any of the outputs of the 3-point DFT exceeds the predetermined threshold value, the frequency valid signal is outputted from comparator 36. The manner in which this frequency confirmation process is performed is described below.

A special form of the DFT (Discrete Fourier Transform) process may be used to confirm the frequency estimated by the IFM receiver. This special form of the DFT process may be defined by equation (1):

$$X(k) = \sum_{n=0}^{N-1} x(n) e^{\frac{-j2\pi kn}{N}} \quad (1)$$

where N is the total number of time samples used in the calculation, n is an index for each time sample, k is a frequency index which for this special form takes on three of the N values equally spaced between zero and the sampling frequency. The second expression in the above equation, the exponential term, is referred to as the DFT "kernel" function.

The following example is used to explain the exemplary process of the DFT "kernel" function according to an exemplary embodiment of the invention. If the sampling frequency $f_s$ is at 2.56 GHz, and the input is complex with I & Q channels, then the receiver may be able to cover 2.56 GHz. The general form of the DFT kernel function has, for example, 256 by 256 elements, because the general DFT may use 256 input sample points and the output of the DFT may have 256 frequency components.

The number of input time samples may be chosen to be as large as possible to maximize processing gain. Preferably, the number of input time samples chosen is never greater than the minimum pulse width of the received signal that the IFM must process. The number of frequency components may be determined by the required frequency resolution of the IFM receiver. Therefore, 256 squared, or 65,536 calculations may be required to compute a complete general DFT. An example of this special kernel function matrix is shown in Equation 2.

$$\text{Kernel} = \begin{bmatrix} q_{1,1} & q_{1,2} & q_{1,3} & \cdots & q_{1,256} \\ q_{2,1} & q_{2,2} & q_{2,3} & \cdots & q_{2,256} \\ \vdots & & & & \\ q_{256,1} & q_{256,2} & q_{256,3} & \cdots & q_{256,256} \end{bmatrix} \Bigg\} \text{time} \quad (2)$$

$$\overbrace{\phantom{xxxxxxxxxxxxxxxxxxxxx}}^{k \text{ frequency components}}$$

In this general DFT kernel function matrix, the elements may have values as defined in Equation 3. These elements represent N unity magnitude vectors equally spaced about a unit circle.

$$q_{k,n} = e^{\frac{-j2\pi kn}{N}} \quad (3)$$

In an exemplary embodiment of the invention, the elements in the DFT kernel matrix may be quantized to only four allowable phase angles corresponding to 0, 90, 180 and 270 degrees. Any element greater than or equal to $7\pi/4$ degrees and less than $\pi/4$ degrees may be assigned a phase angle of 0 degrees. Any element greater than or equal to $\pi/4$ and less than $3\pi/4$ may be assigned a phase angle of 90 degrees. Any element greater than or equal to $3\pi/4$ and less than $5\pi/4$ may be assigned a phase angle of 180 degrees. Any element greater than or equal to $5\pi/4$ and less than $7\pi/4$ may be assigned a phase angle of 270 degrees.

Using complex number representation, each of the q elements in the matrix may have four values: 1, −1, j, and −j, where j is $\sqrt{-1}$. The matrix multiplication operation, which may be used to determine all the frequency components of an input signal, is shown below in Equation 4.

$$X(k) = [n_1 n_2 n_3 \ldots n_{256}] \begin{bmatrix} q_{1,1} & q_{1,2} & q_{1,3} & \cdots & q_{1,256} \\ q_{2,1} & q_{2,2} & q_{2,3} & \cdots & q_{2,256} \\ \vdots & & & & \\ q_{256,1} & q_{256,2} & q_{256,3} & \cdots & q_{256,256} \end{bmatrix} \overset{k\ frequency\ components}{} \quad (4)$$

where $n_1, n_2, \ldots n_{256}$ are the input data sample points.

According to an exemplary embodiment of the invention, the input data sample points may be complex. However, the input data may only have values of ±1 or ±j. Thus, the operation in Equation (4) is easy to implement because there is no multiplication required.

Figure 3:
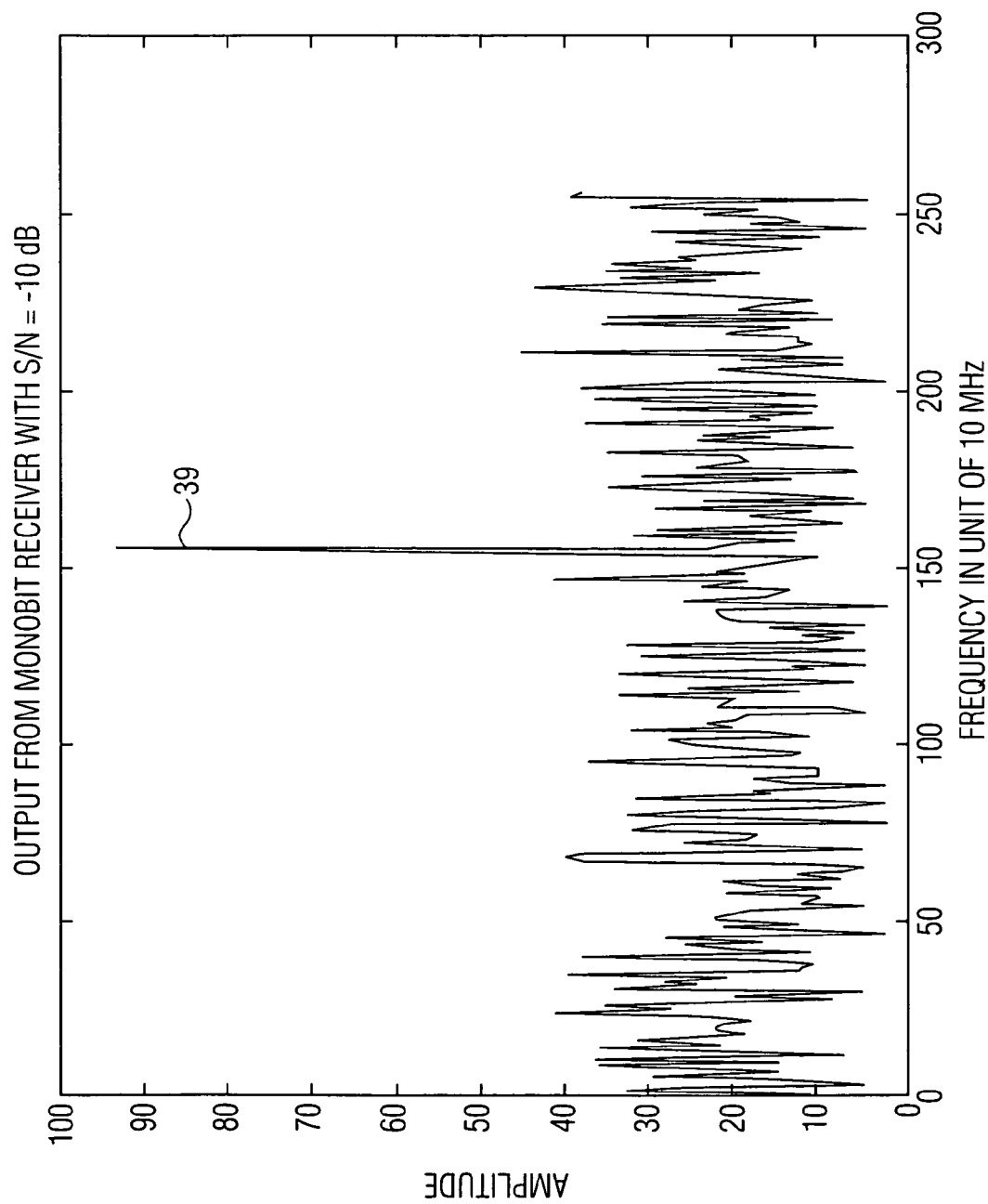
FIG. 3 shows signal amplitude output versus frequency of an IFM receiver, when receiving one signal having a signal to noise ratio (S/N) of −10 dB, in accordance with an exemplary embodiment of the present invention.

FIG. 3 shows an example of a signal output from the IFM receiver performing the calculation shown in Equation (4), in accordance with an exemplary embodiment of the present invention. It is contemplated that other signal outputs may show spikes at different frequencies corresponding to different frequencies of the input signals. As shown in FIG. 3, there is only one signal present, indicated by spike 39, which was received at a signal-to-noise ratio (S/N) equal to −10 dB. Spike 39, at the corresponding frequency, implies more sensitivity than a typical digital IFM receiver would possess, because of the channelization operation (coherent gain) implicit by the DFT operation. Simulated results show that a typical digital IFM receiver has a sensitivity of about S/N=−4 dB.

Figure 4:
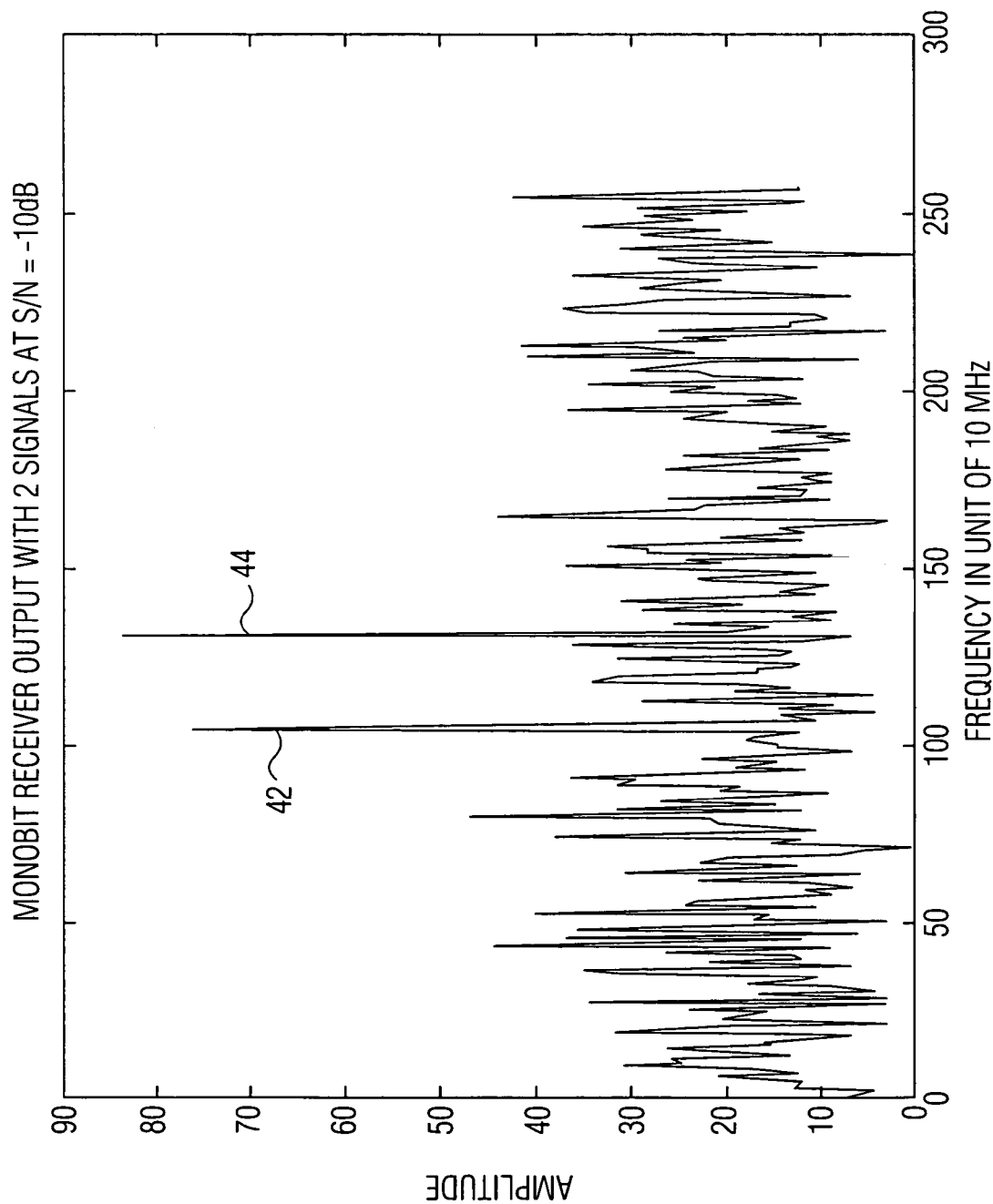
FIG. 4 shows signal amplitude output versus frequency of an IFM receiver, when receiving two simultaneous signals each having a signal to noise ratio (S/N) of −10 dB, in accordance with an exemplary embodiment of the present invention.

FIG. 4 shows an example of an IFM receiver correctly determining the frequency of two simultaneous input signals. Both input signals are assumed to have equal amplitudes and are being processed at an input S/N of −10 dB. As shown in FIG. 4, both signal frequencies are clearly identified as spikes 42 and 44. Thus, FIG. 4 illustrates that the DFT process of the present invention can clearly identify one signal, or multiple simultaneous signals that are present at the input to the IFM receiver, even at a −10 dB S/N ratio.

Figure 5:
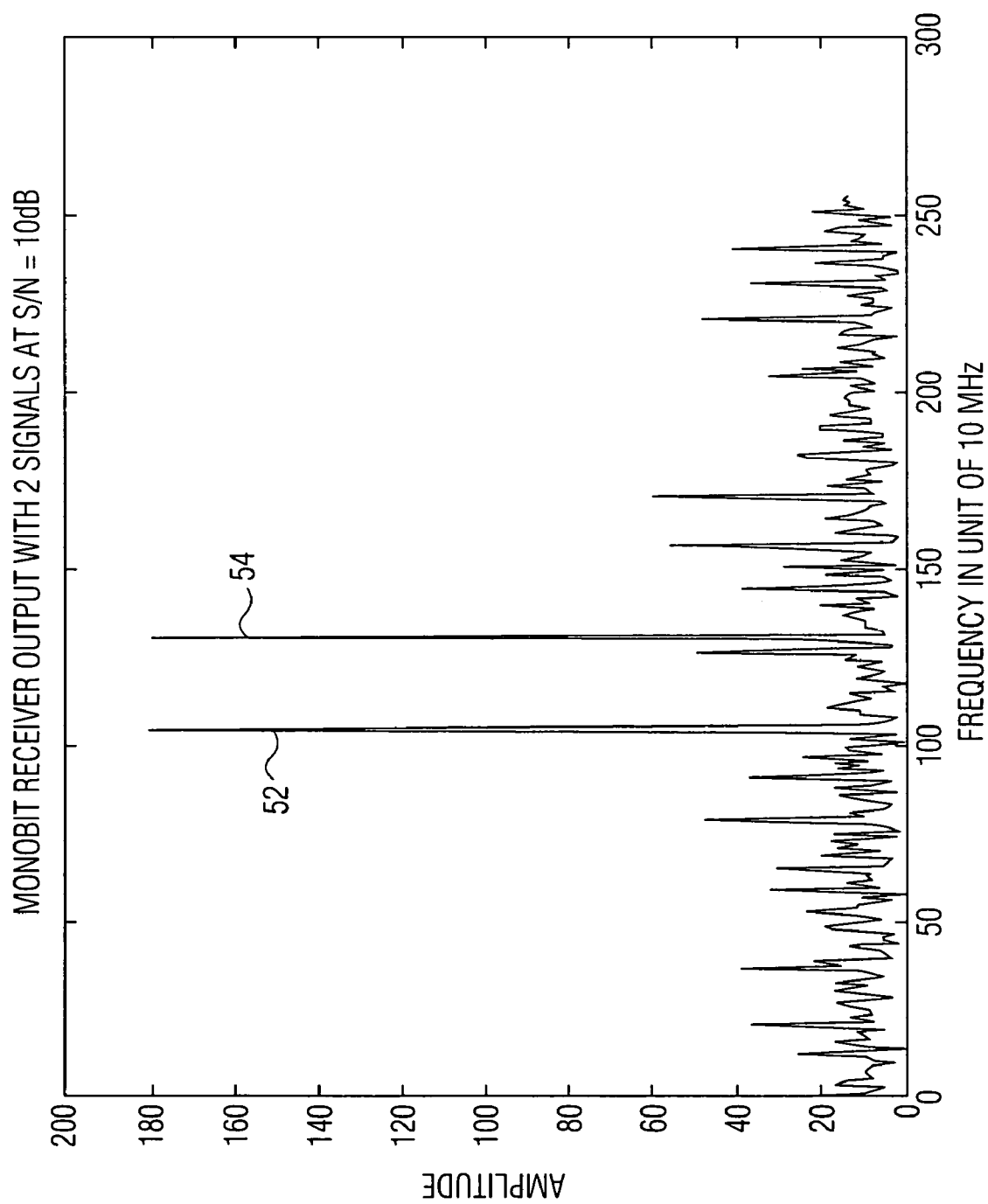
FIG. 5 shows signal amplitude output versus frequency of an IFM receiver, when receiving two simultaneous signals each having a signal to noise ratio (S/N) of 10 dB, in accordance with an exemplary embodiment of the present invention.

FIG. 5 shows the same frequencies as those shown in FIG. 4, but the S/N of each received signal is at +10 dB rather than −10 dB. As shown, the two identified input signals are represented as spikes 52 and 54 located at their corresponding frequencies (shown in units of 10 MHz).

It will be appreciated that in FIGS. 3-5, the signal amplitudes outputted by the IFM receiver are higher than the noise level, after a monobit operation performed by the IFM receiver. According to an exemplary embodiment of the invention, a predetermined threshold value may be selected to separate the input signals from the noise level. The predetermined threshold value may be used to confirm whether the frequency determined by the IFM receiver is correct or not correct.

It is contemplated that threshold values may vary. The predetermined threshold value for the signal outputs shown in FIG. 4 may be set at 60 nominal units, for example. Thus, the frequencies corresponding to spikes 42 and 44 may both be confirmed to be correct. Alternatively, the predetermined threshold value for the signal outputs shown in FIG. 4 may be set at 80 nominal units, for example. In such case, only the frequency corresponding to spike 44 may be confirmed to be correct. The spike 42 has an amplitude value below the predetermined threshold and would not be confirmed by the present invention.

According to another embodiment of the invention, it may not be necessary to calculate all the DFT frequency components from the monobit receiver to confirm the existence of a frequency. An IFM receiver may output one or two frequency measurements, as shown, for example, in FIGS. 3-5. It is contemplated that only that one frequency component (or two frequency components if two simultaneous signals are present), which is determined by the monobit receiver, needs to be confirmed by the present invention. In other words, if the monobit receiver determines that an input signal has a frequency component corresponding to spike 39, shown in FIG. 3, then the present invention only needs to confirm the presence or absence of a frequency corresponding to spike 39.

In this embodiment of only confirming the presence or absence of one specific frequency component, the present invention only requires multiplying 256 input sample points (for example) with values of only one column of ±1s or ±js (corresponding to a specific frequency index of k in the DFT matrix) and summing the results. If the summed output is above a predetermined threshold, then the output may be determined to be a correct frequency.

The inventors, however, have determined that it is better if more than one frequency component is calculated, because an input frequency may fall between two adjacent channels of an IFM receiver and the corresponding output may then be lower than the threshold value.

According to an exemplary embodiment of the invention, the inventors have determined that calculating 2 or 3 frequency components works well. For example, if 3 frequency components are calculated, where the 3 frequency components are centered about the frequency determined by the monobit receiver, then Equation (4) may be simplified as Equation (5) shown below.

$$X(k) = [n_1 n_2 n_3 \ldots n_{256}] \begin{bmatrix} q_{1,k-1} & q_{1,k} & q_{1,k+1} \\ q_{2,k-1} & q_k & q_{2,k+1} \\ \vdots & & \\ q_{256,k-11} & q_{256,k} & q_{256,k+1} \end{bmatrix} \overset{3\ frequency\ components}{} \Biggr\} time \quad (5)$$

where the k value corresponds to the frequency determined by the IFM receiver.

Using equation 5 by the present invention generates 3 frequency component outputs. The highest amplitude output of the 3 frequency components may be compared against a predetermined threshold. Using 3 frequency components in the operation of the present invention advantageously eliminates the problem of a signal falling between two channels. Alternatively, the inventors have determined that a 2-component operation may also eliminate this problem. Further, the 2-component operation, which is less processing intensive, is preferable to the 3-component operation.

FIGS. 6A, 6B, 7A, 7B, 8A, 8B, 9A and 9B are simulation results showing frequency data confirmed by the DFT operation of the present invention using the 3-point DFT shown in FIG. 2. FIGS. 6A through 7B show results from one signal inputted at a S/N ratio of −6 dB. FIGS. 8A through 9B show results from two signals inputted simultaneously at a S/N ratio of 10 dB. Under both of these conditions, the 3-point DFT processor (35) of FIG. 2 generates a correct frequency confirmation of one input signal or two input signals, when the predetermined threshold for the threshold detector (36) is set to a proper level.

Figure 6A:
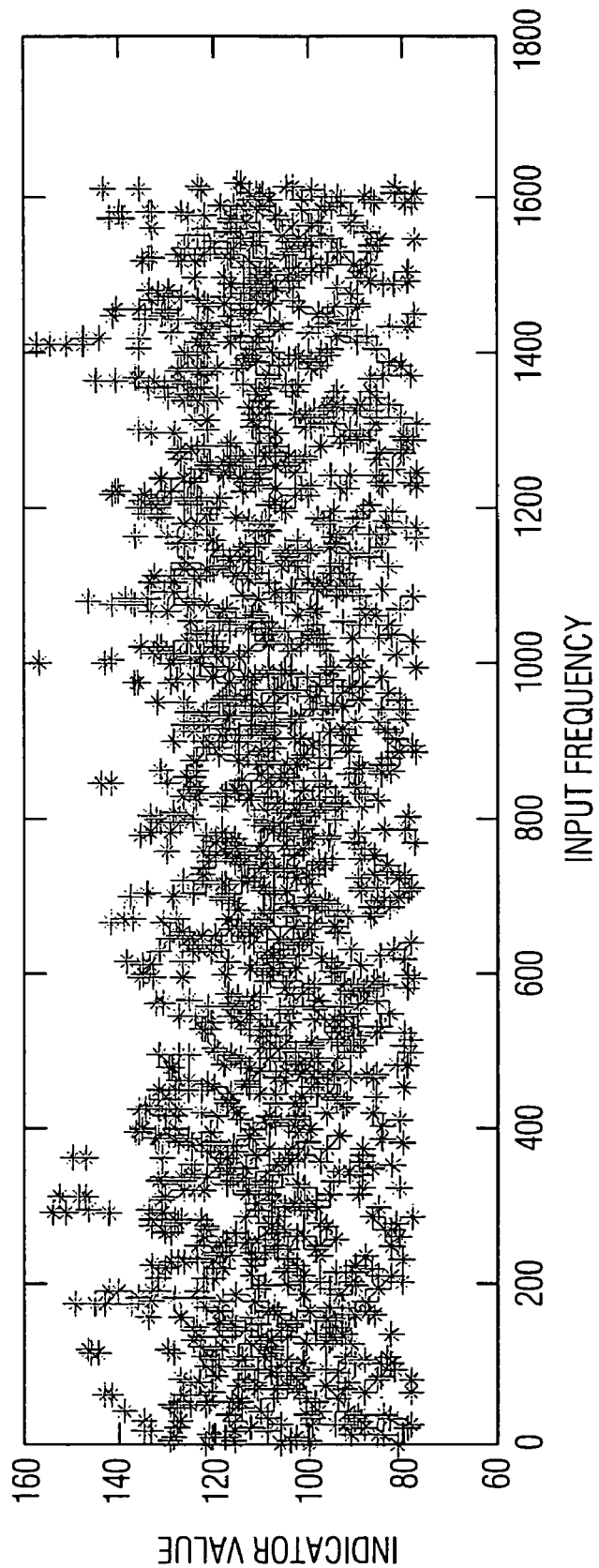
FIG. 6A shows indicator values of output amplitude versus input frequency data of an IFM receiver processing an input signal at a S/N of −6 dB, indicating good frequency readings when used with a predetermined threshold value, in accordance with an exemplary embodiment of the present invention.
Figure 6B:
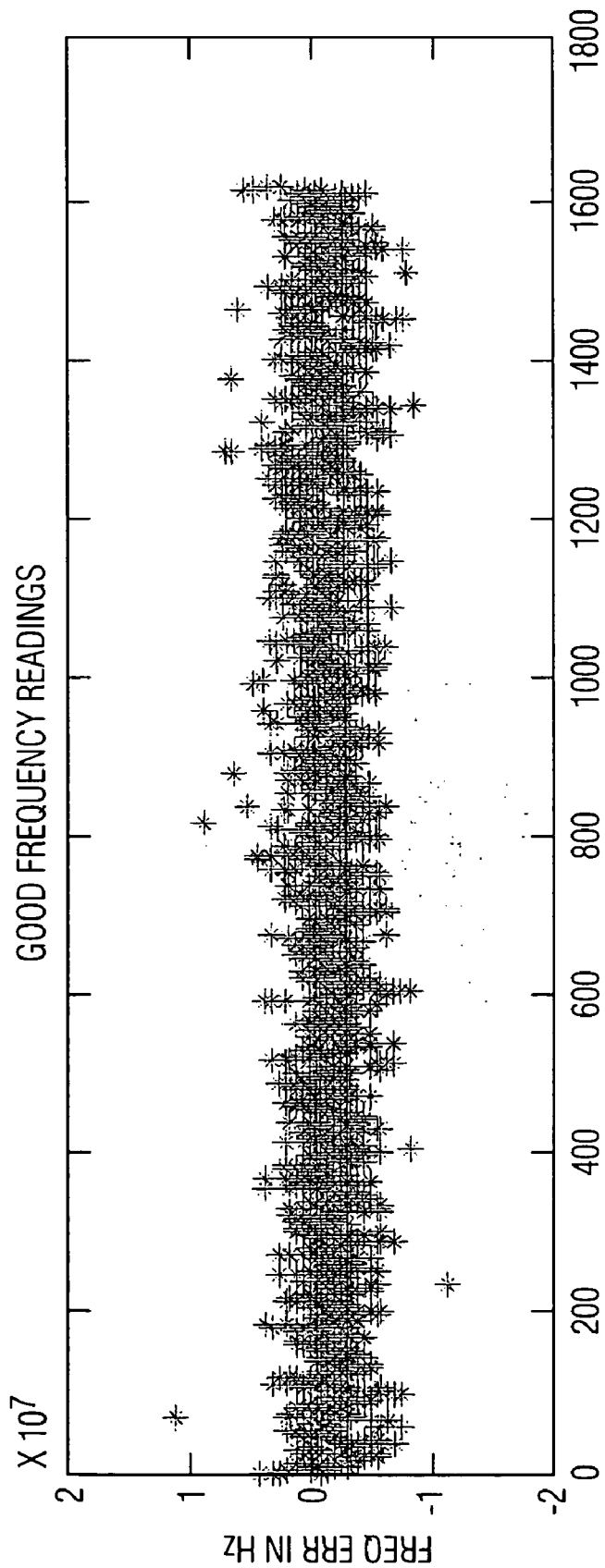
FIG. 6B shows frequency error versus input frequency data corresponding to the indicator values shown in FIG. 6A.

More specifically, FIG. 6A shows indicator values (at nominal amplitude units) versus input frequency (in MHz) of one input signal having a S/N ratio of −6 dB at the IFM receiver input port. The indicator values show good frequency readings after the 3-point DFT operation and the thresholding are performed. FIG. 6B confirms the good frequency readings because the frequency errors (in Hz) between the calculated DFT frequencies and the input frequencies are small.

Using FIG. 6A, the indicator value outputs may be used to set the predetermined threshold value. If the indicator values are above or equal to a properly set predetermined threshold, the frequency of the input signal may be properly confirmed by the invention. In the simulation results of FIG. 6A, the IFM receiver generates about 1600 correct frequencies with the largest error about 10 MHz. The inventors have determined this error to be reasonable for low S/N conditions, such as a −6 dB input signal. According to the exemplary embodiment shown in FIG. 6A, the predetermined threshold value is set at 78 nominal amplitude units.

Figure 7A:
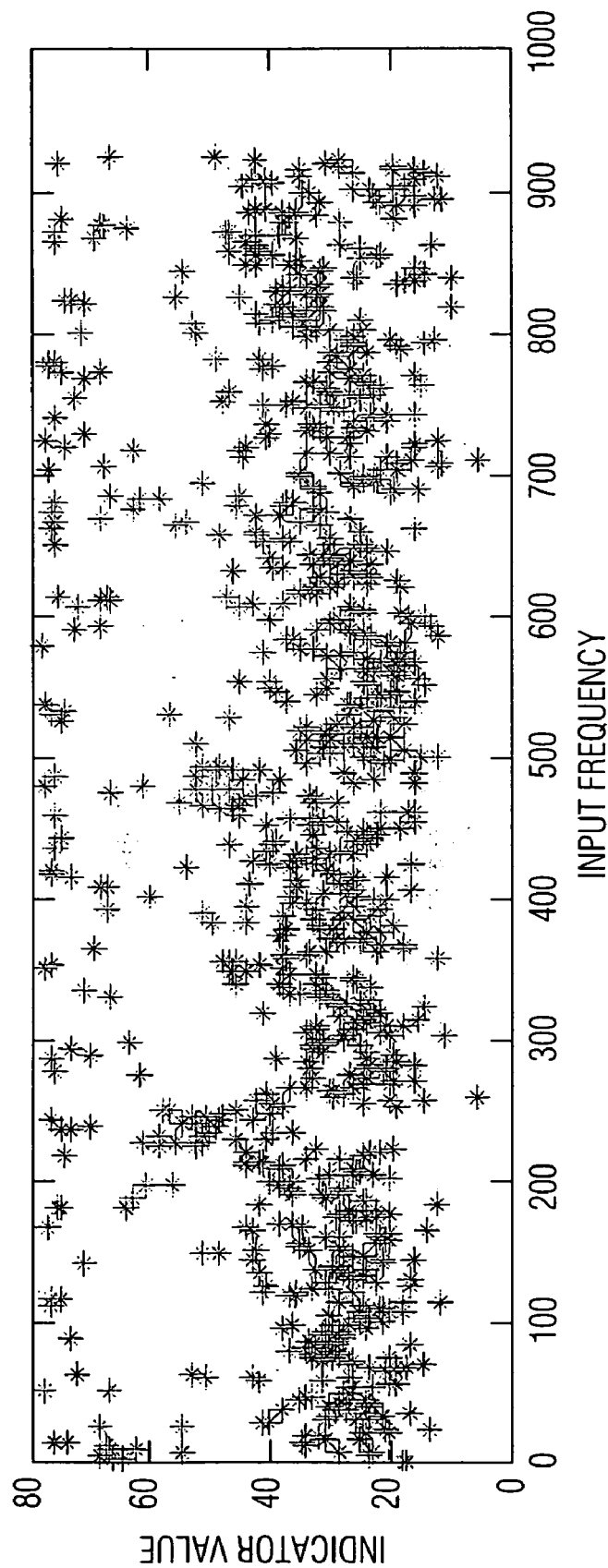
FIG. 7A shows indicator values of output amplitude versus input frequency data of an IFM receiver processing an input signal at a S/N of −6 dB, indicating bad frequency readings when used with an incorrectly set threshold value.
Figure 7B:
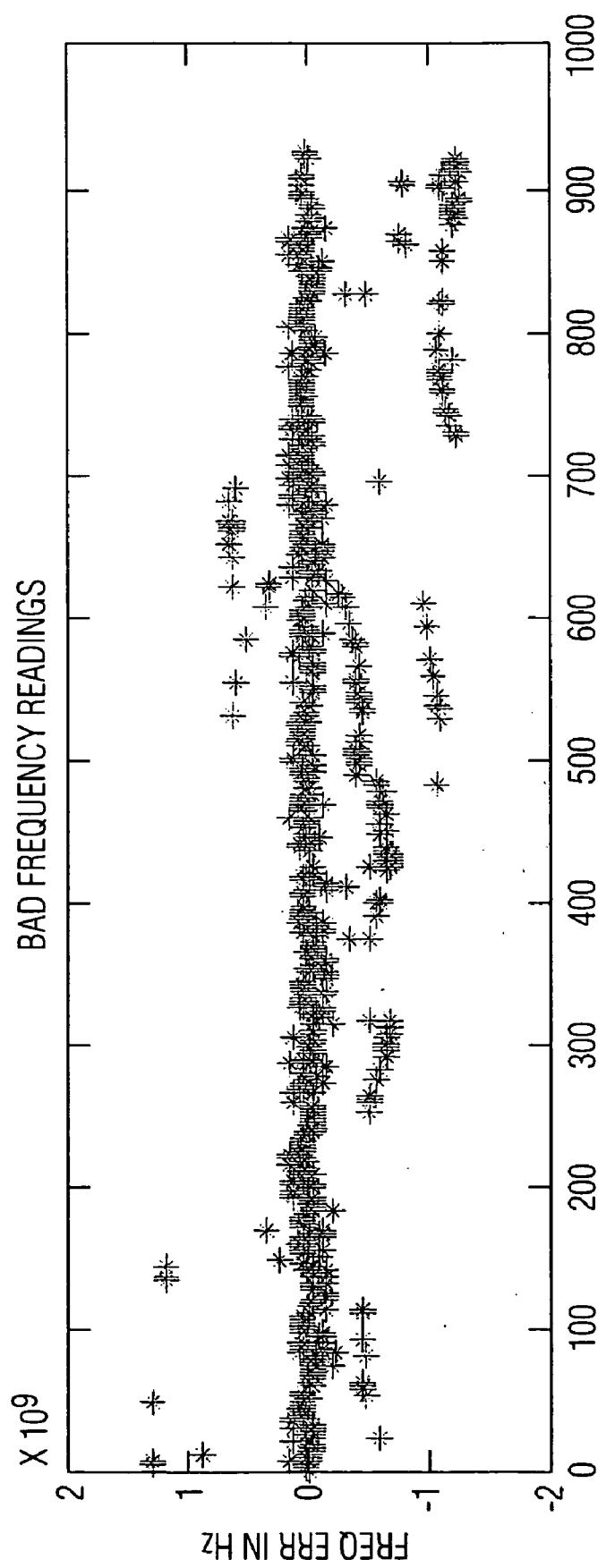
FIG. 7B shows frequency error versus input frequency data corresponding to the indicator values shown in FIG. 7A.

On the other hand, results of the simulation shown in FIG. 7A exemplify over 900 bad frequency readings, as read by the indicator. As shown in FIG. 7B, the corresponding errors are quite large (note the scale of the graph). The signal conditions for FIG. 7A are the same as the signal conditions for FIG. 6A, except that the predetermined threshold value is set much lower at a nominal value of 10.

Figure 8A:
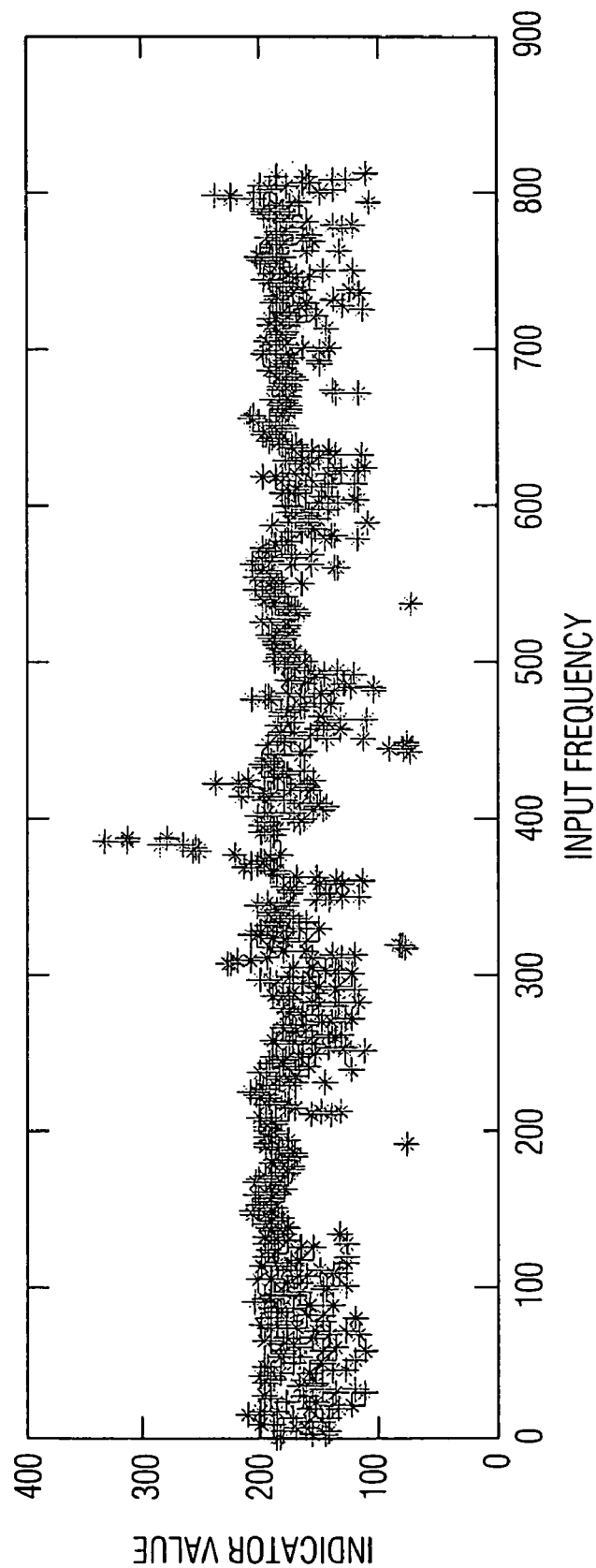
FIG. 8A shows indicator values of output amplitude versus input frequency data of an IFM receiver processing two simultaneous signal inputs, each at a S/N of 10 dB, indicating good frequency readings, when used with a predetermined threshold value, in accordance with an exemplary embodiment of the present invention.
Figure 8B:
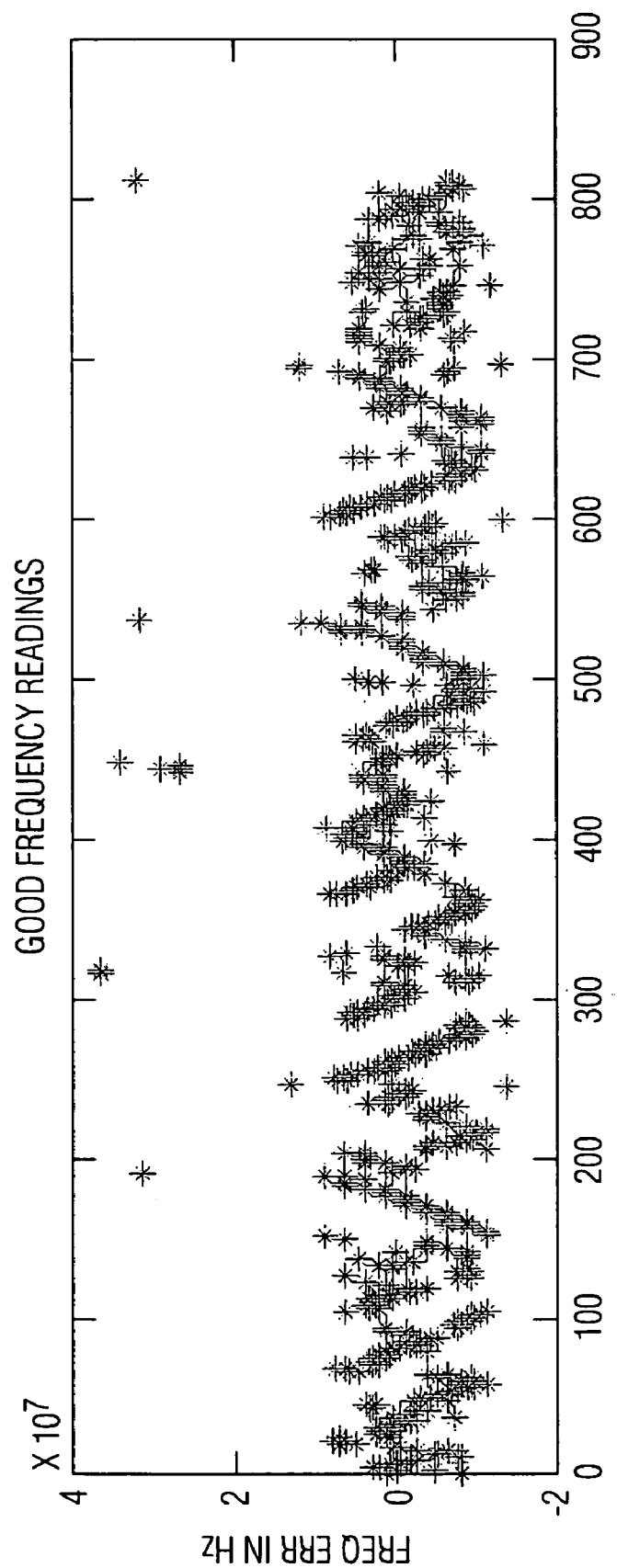
FIG. 8B shows frequency error versus input frequency data corresponding to the indicator values shown in FIG. 8A.

FIG. 8A shows indicator values (at nominal amplitude units) versus input frequency (in MHz) of two simultaneous input signals having a S/N ratio of 10 dB at the IFM receiver input port. The indicator values show good frequency readings after the 3-point DFT operation and the thresholding are performed. FIG. 8B confirms the good frequency readings because the frequency errors (in Hz) between the calculated DFT frequencies and the input frequencies are small. As shown in FIG. 8B, most of the frequency errors are within 20 MHz. The inventors have determined this error to be reasonable for these conditions.

Figure 9A:
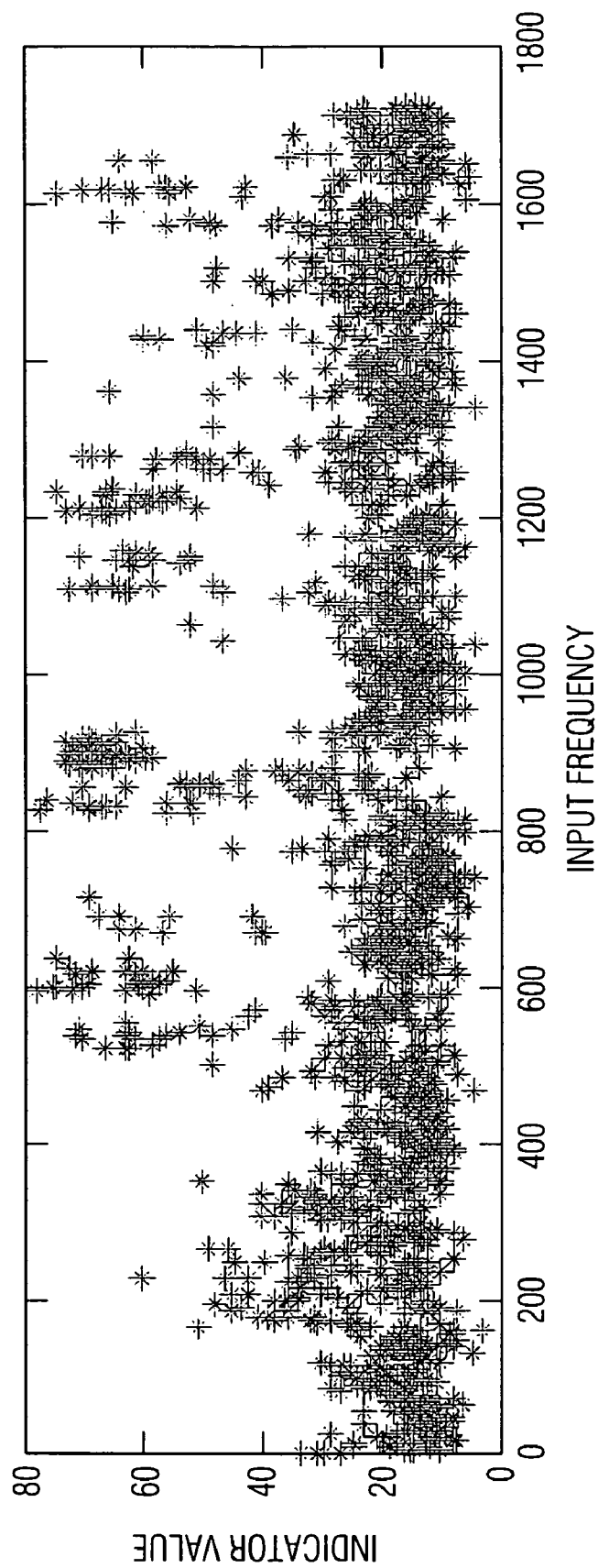
FIG. 9A shows indicator values of output amplitude versus input frequency data of an IFM receiver processing two simultaneous signal inputs, each at a S/N of 10 dB, indicating bad frequency readings, when used with an incorrectly set threshold value.
Figure 9B:
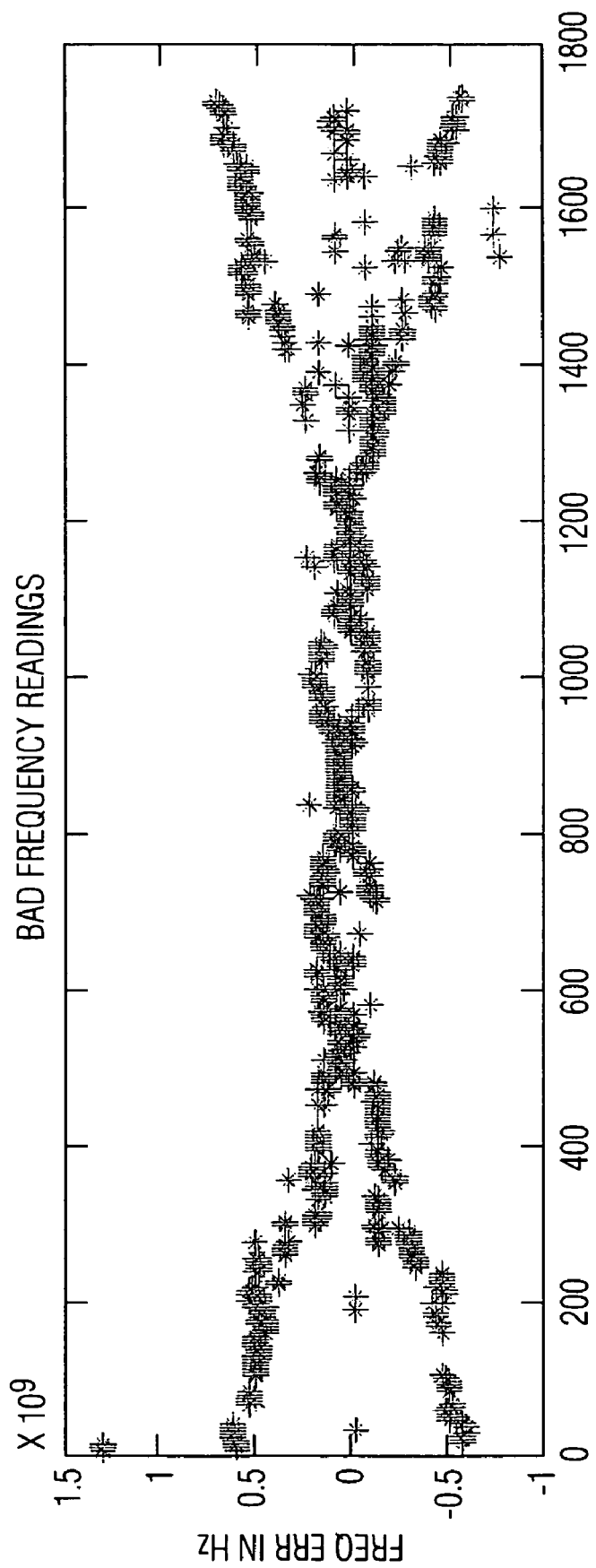
FIG. 9B shows frequency error versus input frequency data corresponding to the indicator values shown in FIG. 9A.

On the other hand, results of the simulation shown in FIG. 9A exemplify over 1700 bad frequency readings, as read by the indicator. As shown in FIG. 9B, the corresponding errors are quite large (note the scale of the graph). The signal conditions for FIG. 9A are the same as the signal conditions for FIG. 8A, except that the predetermined threshold value is set much lower, thereby resulting in bad frequency readings.

It will be appreciated that a conventional IFM receiver may detect a simultaneous signal condition and return no frequency data at all, or may fail to detect the simultaneous signal condition and report a frequency that has a high probability of error. However, as described above, the present invention advantageously identifies whether the frequency estimated by an IFM receiver is correct or incorrect, and does so for a single input signal or multiple input signals.

Figure 10:
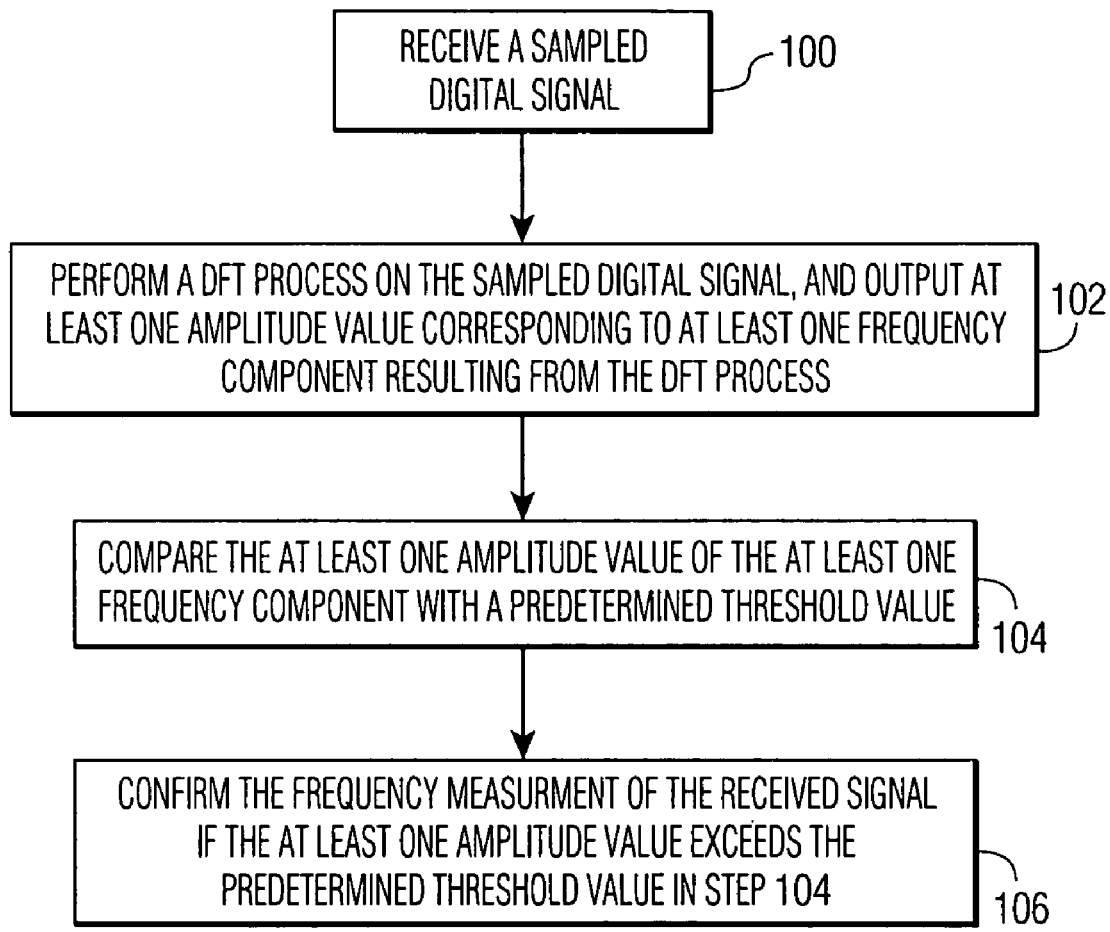
FIG. 10 is a flowchart illustrating a method of confirming an instantaneous frequency measurement of a received signal, in accordance with an exemplary embodiment of the present invention.

FIG. 10 is a flowchart illustrating a method of confirming a frequency measurement of an IFM receiver in accordance with an exemplary embodiment of the present invention. At step 100, a sampled digital signal may be received, for example, by digital processor 30. At step 102, a DFT process may be performed on the sampled digital signal.

It is contemplated that only one frequency component from the exemplary IFM receiver may be calculated. This frequency component may be the same, or adjacent to the frequency component determined by the IFM receiver (as determined by encoder 34 in FIG. 2, for example). However, as described above, it is better if more frequency components are calculated, because the input frequency may fall between two adjacent channels of the IFM receiver and the corresponding output may be lower than the threshold value. For example, 3 frequency components may be used, thereby using the 3-point DFT shown in FIG. 2. Desirably, the three frequency components may be centered about the frequency measurement of the received signal (as determined by encoder 34, for example).

One frequency value may be selected which corresponds to the one frequency component similar to the frequency measurement of the IFM receiver. A 1-point DFT (similar to element 35 in FIG. 2) coherently processes the input samples and outputs a summed coherent signal. This amplitude value of the summed coherent signal may then be outputted to threshold detector 36 and compared with a predetermined threshold value.

On the other hand, if three frequency values are selected which are centered approximately about the frequency measurement of the IFM receiver, then a 3-point DFT process is used to coherently process the input samples and output three summed coherent signals. The largest of the three summed coherent signals may then be inputted into the threshold detector (36) for comparison against a predetermined threshold value.

Specific performance requirements may dictate the correct setting of the threshold value. At step 106, the method confirms the frequency measurement (or measurements) of the received signal (or multiple signals), if the coherently summed amplitude value from the DFT processor exceeds the predetermined threshold value.

In the above discussion, various examples are used to explain the basic concept of the frequency confirmation method. However, it is contemplated that other variations may be used to either simplify the actual design or modify performance. For example, 128 time sample points rather than 256 time sample points may be used. Further, any number of DFT frequency components may be used, such as 1, 2, 3, etc. Specific performance requirements for a particular IFM receiver may dictate which embodiment of the present invention is implemented.

What is claimed is:

1. An apparatus for confirming a frequency measurement of a received signal comprising a discrete Fourier transform (DFT) module for receiving a sampled digital signal, the DFT module configured to analyze the received sampled digital signal, and output amplitude values at different frequency components, and a threshold comparator for receiving the amplitude values of the frequency components and outputting a thresholded-amplitude value exceeding a predetermined threshold value, wherein a frequency confirmation is provided to a user based on the thresholded-amplitude value, and the DFT module includes the following DFT kernel function:

$$\begin{bmatrix} q_1, k-1 & q_1, k & q_1 k+1 \\ q_2, k-1 & q_2, k & q_2 k+1 \\ \vdots & \vdots & \vdots \\ \vdots & \vdots & \vdots \\ q_n, k-1 & q_n k & q_n, k+1 \end{bmatrix}$$

where k−1, k, and k+1 are adjacent frequency components, n is the number of time samples used in each DFT analysis, and q is a kernel having four possible values of 1, −1, j and −j, where j is $\sqrt{-1}$.

2. The apparatus of claim 1, wherein the sampled digital signal is sampled at a sampling frequency of $f_s$, and the DFT module is configured to analyze the received sampled digital signal at a frequency bandwidth that is equal to or less than $f_s$.

3. The apparatus of claim 2, wherein the frequency bandwidth is equal to the sampling frequency of $f_s$, when the received sampled digital signal includes I and Q signals.

4. The apparatus of claim 1, wherein the DFT module is configured to analyze the received sampled digital signal by examining N frequency components, where N equals the total number of frequency components equally spaced between 0 and the sampling frequency.

5. The apparatus of claim 4, wherein N equals the total number of time samples used in each DFT analysis to determine the amplitude values corresponding to the N frequency components.

6. The apparatus of claim 4, wherein the DFT module is configured to analyze at least 3 frequency components equally spaced about the frequency measurement of the received signal.

7. The apparatus of claim 6, wherein the DFT module is configured to analyze 3 frequency components at k−1, k, and k+1, where k corresponds to a frequency component similar to the frequency measurement of the received signal.

8. The apparatus of claim 1, wherein the frequency confirmation is provided when the thresholded-amplitude value is of a frequency component similar to the frequency measurement of the received signal.

9. The apparatus of claim 1, wherein the sampling module includes a 90° hybrid for outputting inphase (I) and quadrature (Q) sampled digital signals.

10. The apparatus of claim 9, wherein the sampling module includes analog-to-digital converters (ADCs) for sampling I and Q signals provided by the 90° hybrid to form the I and Q sampled digital signals.

11. A method of confirming a frequency measurement of a received signal, comprising the steps of:

(a) receiving a sampled digital signal;

(b) performing a DFT process on the sampled digital signal, and outputting at least one amplitude value corresponding to at least one frequency component resulting from the DFT process, wherein the DFT process includes the following DFT kernel function:

$$\begin{bmatrix} q_1, k-1 & q_1, k & q_1 k+1 \\ q_2, k-1 & q_2, k & q_2, k+1 \\ \vdots & \vdots & \vdots \\ \vdots & \vdots & \vdots \\ q_n, k-1 & q_n, k & q_n, k+1 \end{bmatrix}$$

where k−1, k, and k+1 are adjacent frequency components, n is the number of time samples used in each DFT analysis, and q is a kernel having four possible values of 1, −1, j and −j, where j is $\sqrt{-1}$, (c) comparing the at least one amplitude value of the at least one frequency component with a predetermined threshold value, and (d) confirming as an output to a user the frequency measurement of the received signal if the at least one amplitude value exceeds the predetermined threshold value in step (c).

12. The method of claim 11, wherein step (b) includes outputting amplitude values of at least 3 frequency components, wherein the at least 3 frequency components are centered about the frequency measurement of the received signal.

13. The method of claim 11, wherein step (b) includes selecting the one amplitude value corresponding to the one frequency component that is similar to the frequency measurement of the received signal, and outputting the selected amplitude value for comparing in step (c).

14. An instantaneous frequency measurement (IFM) receiver comprising a receiver module for determining and confirming a frequency of a received signal to a user, a discrete Fourier transform (DFT) module configured to analyze at least 3 frequency components of the received signal at k−1, k, and k+1, where k corresponds to a frequency component similar to the frequency determined by the receiver module, k−1 and k+1 are adjacent frequency components at opposite sides of the k frequency components, wherein the DFT module includes the following DFT kernel function:

$$\begin{bmatrix} q_1, k-1 & q_1, k & q_1 k+1 \\ q_2, k-1 & q_2, k & q_2 k+1 \\ \vdots & \vdots & \vdots \\ \vdots & \vdots & \vdots \\ q_n, k-1 & q_n k & q_n, k+1 \end{bmatrix}$$

where k−1, k, and k+1 are adjacent frequency components, n is the number of time samples used in each DFT analysis, and q is a kernel having four possible values of 1, −1, j and −j, where j is $\sqrt{-1}$.

15. The IFM receiver of claim 14, including
a threshold comparator for receiving amplitude values of the frequency components, and outputting a thresholded-amplitude value exceeding a predetermined threshold value, and
a frequency valid signal provided as a frequency confirmation signal, based on the thresholded-amplitude value.

16. The IFM receiver of claim 14, wherein the adjacent frequency components of k are separated by a predetermined frequency resolution value of the DFT kernel function, and the number of time samples n is predetermined to be substantially large to maximize processing gain and smaller than a minimum pulse width of the received signal.

* * * * *